(12) United States Patent
Zundel et al.

(10) Patent No.: US 10,593,799 B2
(45) Date of Patent: Mar. 17, 2020

(54) SEMICONDUCTOR COMPONENT COMPRISING TRENCH STRUCTURES AND PRODUCTION METHOD THEREFOR

(71) Applicant: Infineon Technologies AG, Neubiberg (DE)

(72) Inventors: Markus Zundel, Egmating (DE); Karl-Heinz Bach, Groebenzell (DE); Peter Brandl, Finkenstein (AT); Andrew Christopher Graeme Wood, St. Jakob im Rosental (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/100,496

(22) Filed: Aug. 10, 2018

(65) Prior Publication Data
US 2019/0051749 A1 Feb. 14, 2019

(30) Foreign Application Priority Data
Aug. 11, 2017 (DE) .................. 10 2017 118 352

(51) Int. Cl.
*H01L 29/78* (2006.01)
*H01L 29/423* (2006.01)
(Continued)

(52) U.S. Cl.
CPC ...... *H01L 29/7827* (2013.01); *H01L 21/2257* (2013.01); *H01L 21/266* (2013.01); *H01L 29/0696* (2013.01); *H01L 29/0878* (2013.01); *H01L 29/1095* (2013.01); *H01L 29/404* (2013.01); *H01L 29/407* (2013.01); *H01L 29/4236* (2013.01); *H01L 29/66666* (2013.01);
(Continued)

(58) Field of Classification Search
CPC .................................................. H01L 29/7827
See application file for complete search history.

(56) References Cited

U.S. PATENT DOCUMENTS 6,285,060 B1 * 9/2001 Korec ................. H01L 29/1095
257/342
6,885,062 B2 4/2005 Zundel et al.
(Continued)

FOREIGN PATENT DOCUMENTS

DE 102015120272 A1 6/2016
DE 102015109545 A1 12/2016

*Primary Examiner* — William A Harriston
(74) *Attorney, Agent, or Firm* — Murphy, Bilak & Homiller, PLLC

(57) ABSTRACT

A semiconductor component includes a field-effect transistor arrangement having a drift zone and body region between the drift zone and a first surface of a semiconductor body. Trench structures of a first type extend from the first surface into the semiconductor body and have a maximum lateral dimension at the first surface which is less than a depth of first and second ones of the trench structures. A net doping concentration at a reference depth at a first location in the drift zone is at least 10% greater than at a second location in the drift zone at the reference depth, which is located between the body region and a bottom of the first trench structure. The first location is at the same first lateral distance from the first and second trench structures. The second location is at the same second lateral distance from the first and second trench structures.

22 Claims, 9 Drawing Sheets

(51) Int. Cl.

| | |
|---|---|
| *H01L 29/10* | (2006.01) |
| *H01L 29/66* | (2006.01) |
| *H01L 29/06* | (2006.01) |
| *H01L 29/08* | (2006.01) |
| *H01L 21/225* | (2006.01) |
| *H01L 21/266* | (2006.01) |
| *H01L 29/40* | (2006.01) |
| *H01L 21/265* | (2006.01) |

(52) U.S. Cl.
CPC .. *H01L 29/66712* (2013.01); *H01L 29/66734* (2013.01); *H01L 29/7802* (2013.01); *H01L 29/7813* (2013.01); *H01L 21/2253* (2013.01); *H01L 21/26586* (2013.01)

(56) References Cited

U.S. PATENT DOCUMENTS

| | | | | |
|---|---|---|---|---|
| 9,184,284 B2 * | 11/2015 | Zundel | | H01L 29/7827 |
| 9,443,973 B2 * | 9/2016 | Jin | | H01L 21/2652 |
| 10,074,741 B2 * | 9/2018 | Aichinger | | H01L 29/7804 |
| 2002/0149051 A1 * | 10/2002 | Kinzer | | H01L 29/0634 |
| | | | | 257/335 |
| 2004/0021174 A1 * | 2/2004 | Kobayashi | | H01L 29/7813 |
| | | | | 257/330 |
| 2006/0038223 A1 * | 2/2006 | Darwish | | H01L 29/0634 |
| | | | | 257/330 |
| 2006/0060916 A1 * | 3/2006 | Girdhar | | H01L 29/407 |
| | | | | 257/330 |
| 2007/0194374 A1 * | 8/2007 | Bhalla | | H01L 29/407 |
| | | | | 257/330 |
| 2008/0076222 A1 * | 3/2008 | Zundel | | H01L 29/4236 |
| | | | | 438/270 |
| 2009/0140327 A1 * | 6/2009 | Hirao | | H01L 29/407 |
| | | | | 257/328 |
| 2011/0248340 A1 * | 10/2011 | Hsieh | | H01L 29/0878 |
| | | | | 257/334 |
| 2011/0254088 A1 * | 10/2011 | Darwish | | H01L 29/407 |
| | | | | 257/340 |
| 2013/0056731 A1 * | 3/2013 | Mauder | | H01L 29/6609 |
| | | | | 257/51 |
| 2014/0084362 A1 * | 3/2014 | Schloesser | | H01L 29/66734 |
| | | | | 257/330 |
| 2014/0197876 A1 * | 7/2014 | Laven | | H01L 29/66325 |
| | | | | 327/375 |
| 2015/0221756 A1 * | 8/2015 | Vellei | | H01L 29/7397 |
| | | | | 257/139 |
| 2017/0140938 A1 * | 5/2017 | Niedernostheide | | |
| | | | | H01L 21/2652 |
| 2017/0170264 A1 * | 6/2017 | Mauder | | H01L 27/0629 |

* cited by examiner

SEMICONDUCTOR COMPONENT COMPRISING TRENCH STRUCTURES AND PRODUCTION METHOD THEREFOR

BACKGROUND

The development of semiconductor components such as, for example, insulated gate field effect transistors (IGFETs) strives for an improved compromise between high dielectric strength, e.g. drain-source voltage blocking strength and area-specific resistance in the on state (Ron×A). In this respect, various concepts have been developed which are attributable for example to a lateral charge compensation in the drift zone region of the semiconductor components. The charge compensation can be achieved for example by means of a so-called superjunction (SJ) structure, in which n-type and p-type regions alternating in a lateral direction are arranged, in semiconductor components of medium and high blocking strength or else by means of field electrodes extending in trenches into the drift zone in semiconductor components of medium and low blocking strength.

It is desirable to achieve a further improvement in the area-specific on resistance whilst maintaining the voltage blocking strength.

SUMMARY

The disclosure of this application specifies a semiconductor component comprising a field effect transistor arrangement in a semiconductor body. The field effect transistor arrangement comprises a drift zone and a body region between the drift zone and a first surface of the semiconductor body. The field effect transistor arrangement furthermore comprises a plurality of trench structures of a first type comprising first and second trench structures, which extend from a first surface into the semiconductor body and have a maximum lateral dimension at the first surface which is less than a depth of the first and second trench structures. The first trench structure and the second trench structure are directly adjacent.

A net doping concentration at a reference depth at a first location in the drift zone is at least 10% greater than at a second location in the drift zone at the reference depth, which is located between the body region and a bottom of the first trench structure, wherein the first location is at the same first lateral distance from the first and from the second trench structure, the second location is at the same second lateral distance from the first and from the second trench structure, and the second distance is greater than the first distance.

The disclosure of this application additionally specifies a method for producing a semiconductor component, which comprises forming a field effect transistor arrangement in a semiconductor body. Forming a field effect transistor arrangement comprises forming a plurality of trenches of a first type comprising first and second trenches, which extend from a first surface into the semiconductor body and have a maximum lateral dimension at the first surface which is less than a depth of the first and second trenches, wherein the first trench and the second trench are directly adjacent. Forming the field effect transistor arrangement furthermore comprises setting a net doping concentration in a drift zone at a first location, which is at a same first lateral distance from the first trench and from the second trench, to be at least 10% greater than at a second location, which is at a same second lateral distance from the first trench and from the second trench, wherein the second distance is greater than the first distance and the first location and also the second location are located at a reference depth between the first surface and a bottom of the first trench.

Those skilled in the art will recognize additional features and advantages upon reading the following detailed description, and upon viewing the accompanying drawings.

BRIEF DESCRIPTION OF THE DRAWINGS

The accompanying drawings serve to afford an understanding of exemplary embodiments of the invention. The drawings merely illustrate exemplary embodiments and together with the description serve to elucidate them Further exemplary embodiments and numerous advantages from among those intended are directly evident from the following detailed description. The elements and structures shown in the drawings are not necessarily illustrated in a manner true to scale with respect to one another. Identical reference signs refer to identical or mutually corresponding elements and structures. Features of the exemplary embodiments can be combined with one another in order to arrive at a further exemplary embodiment.

DETAILED DESCRIPTION

Figure 1A:
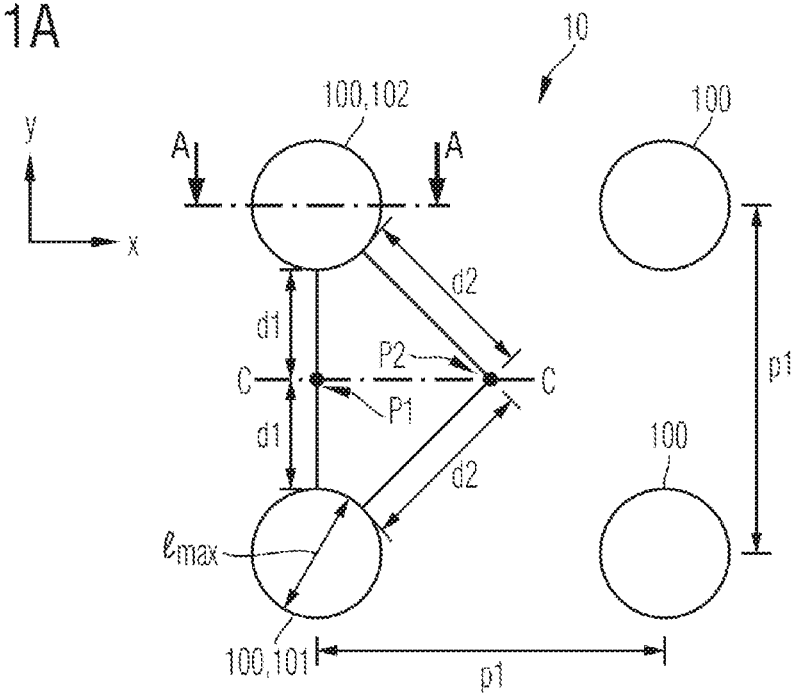
FIGS. 1A and 1B show schematic plan views of trench structures of field effect transistor arrangements in accordance with embodiments of the invention.

In the following detailed description, reference is made to the accompanying drawings, which form part of the disclosure and in which specific exemplary embodiments are shown for illustration purposes. In this context, a direction terminology such as "top side", "bottom", "front side", "rear side", "at the front", "at the back", etc. is related to the orientation of the figures just described. Since the component parts of the exemplary embodiments can be positioned in different orientations, the direction terminology serves merely for elucidation and is in no way limiting.

The description of the exemplary embodiments not limiting, since other exemplary embodiments also exist and structural or logical changes can be made, without departing in the process from the scope defined by the patent claims. In particular, elements of exemplary embodiments described below can be combined with elements of others of the exemplary embodiments described, provided that nothing to the contrary is evident from the context.

In so far as the terms "have", "contain", "encompass", "comprise" and the like are used, they are open terms which indicate the presence of the stated elements or features, but do not exclude the presence of further elements or features. The indefinite articles and the definite articles encompass both the plural and the singular, provided that nothing to the contrary is clearly evident from the context.

In this description, the expressions "coupled" and/or "electrically coupled" do not necessarily mean that the elements must be directly coupled to one another—intervening elements can be provided between the coupled or electrically coupled elements. The expression "electrically connected" intends to describe a low-resistance electrical connection between the connected elements.

The terms "wafer", "substrate" or "semiconductor substrate" that are used in the following description can encompass any semiconductor-based structure which has a semiconductor surface. Wafer and structure should be understood such that they include silicon, silicon-on-insulator (SOI), silicon-on-sapphire (SOS), doped and undoped semiconductors, epitaxial layers of silicon, carried by a base semiconductor support, and other semiconductor structures. The semiconductor need not be based on silicon. The semiconductor could likewise be silicon-germanium, germanium or gallium arsenide. In accordance with other embodiments, silicon carbide (SiC) or allium nitride (GaN) can form the semiconductor substrate material.

The terms "lateral" and "horizontal" such as are used in this description are intended to describe an orientation that extends substantially parallel to a first surface of a semiconductor substrate or semiconductor body.

The term "vertical" such as is used in this description is intended to describe an orientation that extends substantially perpendicular to the first surface of the semiconductor substrate or semiconductor body.

The figures and the description illustrate relative doping concentrations by indicating "−" or "+" next to the doping type "n" or "p". By way of example, "n−" means a doping concentration that is lower than the doping concentration of an "n" doping region, while an "n+" doping region has a higher doping concentration than an "n" doping region. Doping regions of the same relative doping concentration do not necessarily have the same absolute doping concentration. By way of example, two different "n" doping regions can have the same or different absolute doping concentrations. In the figures and the description, the doped regions are often designated by "p"- or "n"-doped, for the sake of better understanding. This designation should on no account be understood to be restrictive. The doping type can be arbitrary as long as the functionality described is achieved. Moreover, the doping types can be interchanged in the exemplary embodiments.

Figure 1B:
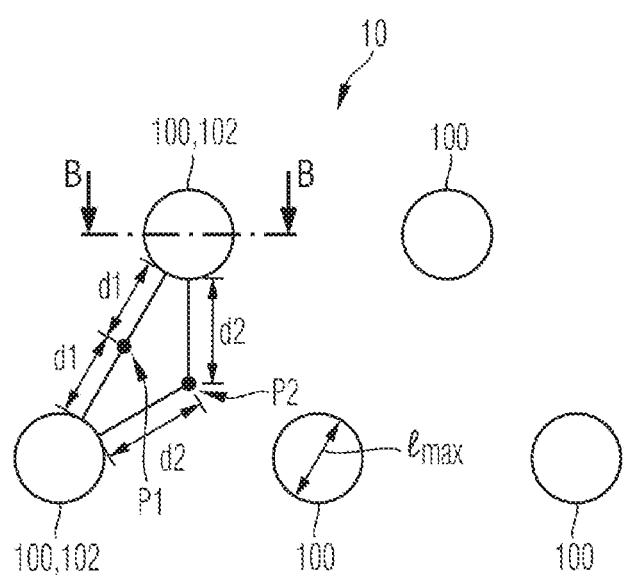
Figure 1C:
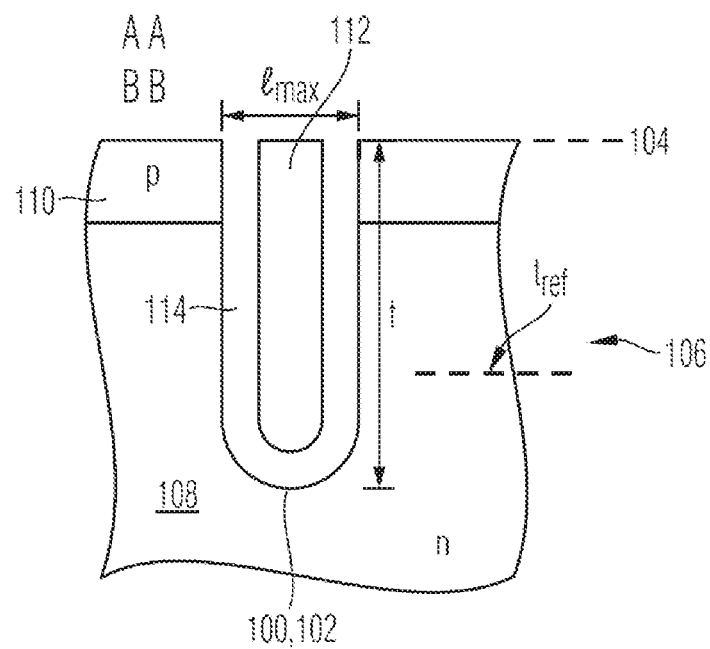
FIG. 1C shows an exemplary cross-sectional view along the sectional lines AA and BB from FIGS. 1A and 1B, respectively.
Figure 1D:
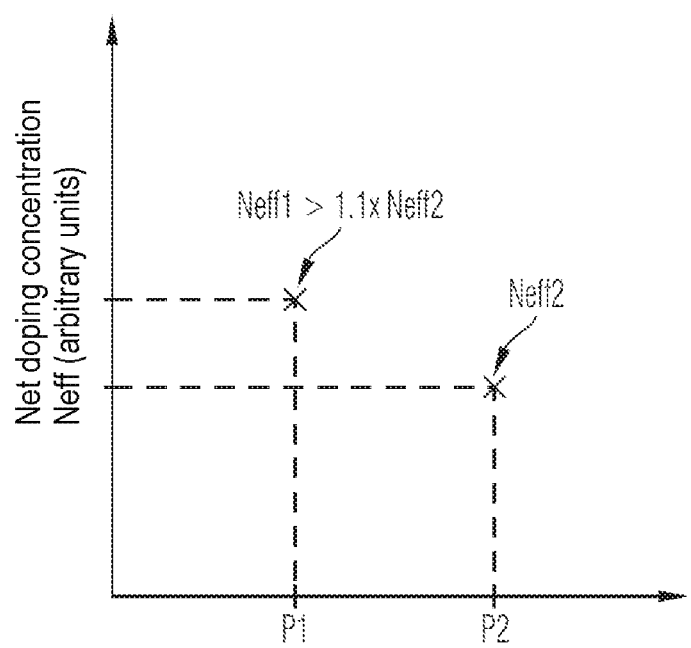
FIG. 1D shows by way of example a net doping concentration Neff at selected locations of the field effect transistor arrangements from FIG. 1A and FIG. 1B.

FIGS. 1A and 1B show schematic plan views of trench structures in accordance with embodiments of field effect transistor arrangements 10. FIG. 1C shows an exemplary cross-sectional view along the sectional lines AA and BB from FIGS. 1A and 1B, and FIG. 1D shows by way of example a net dopant concentration. Neff, at selected locations of the field effect transistor arrangements from FIG. 1A and FIG. 1B.

The plan views shown in FIGS. 1A and 1B show exemplary arrangements of trench structures 100 in accordance with embodiments of field effect transistor arrangements. In the plan view shown in FIG. 1A, the trench structures 100 are arranged in an xy-plane, which spans a first surface of a semiconductor body of the field effect transistor arrangement, at a regular centre-to-centre distance (pitch) p1 along the x-direction and at the same regular centre-to-centre distance (pitch) p1 along the y-direction. The plan view shown in FIG. 1B shows a hexagonal arrangement of the trench structures 100 having a centre-to-centre distance (pitch) p2.

The plan views shown in FIGS. 1A and 1B each have by way of example first and second trench structures 101, 102 which are directly adjacent to one another. It goes without saying that the regular arrangement of the trench structures 100 both in the plan view of FIG. 1A and in the plan view of FIG. 1B include a plurality of trench structures directly adjacent to one another, to which the technical teaching set out below with regard to the first and second trench structures 101, 102 picked out by way of example is applicable.

As in the exemplary cross-sectional view in FIG. 1C extending along the sectional line AA from FIG. 1A or the sectional line BB from FIG. 1B, the second trench structure 102 picked out by way of example from the trench structures 100 extends from a first surface 104 into a semiconductor body 106 and has, at the first surface 104, which is spanned by the xy-plane in the plan views in FIG. 1A and FIG. 1B, a maximum lateral dimension lmax that is less than a depth t of the second trench structure 102, said depth being shown in the cross-sectional view in FIG. 1C. This relation likewise applies to the first trench structure 101 and also to other trench structures from among the trench structures 100. In the case of the trench structures 100 designed in a circular fashion by way of example in the plan views in FIG. 1A and FIG. 1B, the maximum lateral dimension lmax corresponds to the diameter of the trench structures 100 at the first surface 104. It goes without saying that a geometry of the trench structures 100 at the surface 104 can also be of a design that is different from circular, for example ellipsoid or polygonal, e.g. hexagonal. The depth t of the trench structures 100 corresponds to the vertical distance from a bottom of the trench structures 100 to the first surface 104. In view of the illustrated geometry of the trench structures 100, the latter are also referred to as acicular trench structures since they are similar to a needle extending into the semiconductor body.

In one embodiment, a minimum lateral dimension of the trench structures 100 at the first surface 104 is at least 20% of the maximum lateral dimension lmax. Although in the plan views shown in FIGS. 1A and 1B the minimum and maximum lateral dimensions at the first surface 104 correspond in view of the circular geometry of the trench structures 100, this embodiment specifies design rules for, by way of example, elliptic, oval or else polygonal geometries of the trench structures 100 at the first surface 104.

As is illustrated schematically in the cross-sectional view of FIG. 1C, the field effect transistor arrangement comprises a drift zone 108 and a body region 110 between the drift zone and the first surface 104 of the semiconductor body 106. The term mesa region denotes that part of the semiconductor body 106 which extends from the first surface 104 as far as the bottom of the trench structures 100 and thus laterally adjoins the trench structures 100. In the cross section shown in FIG. 1C, the body region 110 and also an upper or uppermost part of the drift zone 108 lie in the mesa region.

The trench structures 100 are of a first type and comprise for example a field electrode 112, which is electrically insulated from the surrounding semiconductor body 106 by a field dielectric 114. Unlike for example a gate electrode that serves to control the channel conductivity, the field electrode performs the function of compensating for charge carriers in the drift zone 108. This compensation effect affords the possibility of doping the drift zone 108 of the field effect transistor arrangement more highly by comparison with components without a field electrode with the voltage blocking strength remaining the same, which leads to the desired reduction of the area-specific on resistance Ron×A. The field dielectric 114 has a greater thickness than a gate dielectric formed elsewhere and can consist of one or a stack of dielectric materials. Exemplary materials are thermal or deposited oxides or a combination thereof, nitrides, oxynitrides, high-k and low-k dielectrics. Typical thicknesses of the field dielectric 114, depending on the desired voltage blocking strength of the component, are in the range of multiple 10 nm to multiple 100 nm, e.g. in the range of 50 nm to 1000 nm, or else in the range of 100 nm to 600 nm.

The first trench structure 101 is directly adjacent to the second trench structure 102. Consequently, a direct connecting line between the first trench structure 101 and the second trench structure 102 does not cross another of the trench structures 100.

A net doping concentration Neff at a reference depth tref, which is located between the body region 110 and a bottom of the first trench structure 101, at a first location P1 in the drift zone 108, which is at a same first lateral distance d1 from the first and from the second trench structure 101, 102, is at least 10%, or at least 20%, greater than at a second location P2 at the reference depth tref, which is at a same second lateral distance d2 from the first and from the second trench structure 101, 102, i.e. Neff(P1)>1.1×Neff(P2). The second distance d2 is greater than the first distance d1. The positions P1 and P2 with associated first and second distances d1, d2 are illustrated by way of example in the schematic plan views of FIGS. 1A and 1B. Both at the first location and at the second location, the first and second trench structures 101, 102 are the trench structures which are closest to said locations, that is to say that at said locations, apart from the first trench structure 101 and the second trench structure 102, there are no other trench structures 100 which laterally are located even closer.

In one embodiment, the first distance d1 establishes a shortest lateral distance from the first trench structure 101 and from the second trench structure 102. Consequently, the first location P1 in this embodiment lies at the centre of a direct connecting line between the first trench structure 101 and the second trench structure 102.

In one embodiment, the second distance d2 is maximally of double the magnitude of the first distance d1. Exemplary plan views of such arrangements of the trench structures 100 are shown in FIG. 1A and FIG. 1B.

The net doping concentration Neff is an effective electrical doping concentration and thus takes account of a partial compensation of an n-doping concentration by a p-doping concentration, or versa. The net doping concentration is measurable for example by the analysis of the semiconductor body using suitable analysis methods. Methods of this type may include for example the methods of Scanning Capacitance Microscopy (SCM), Scanning Spreading Resistance Microscopy (SSRM), Secondary Ion Mass Spectrometry (SIMS) or a combination of these methods.

By means of the lateral variation of the net doping concentration as described above, the effective doping of the drift zone in the mesa region is optimized with regard to the area-specific resistance in the on state Ron×A, since the smaller the distance between adjacent trench structures 100, the greater the intervening net doping of the drift zone of the mesa region may turn out to be. By way of example, a dopant level in a region along a smallest width of the mesa region can be increased to an extent such that this region is still just depletable.

In one embodiment, the net doping concentration Neff in the drift zone 108 fails continuously along a direct connecting line from the first location P1 to the second location P2. Such a fall is illustrated in the schematic diagram in FIG. 2 by way of example for the connecting line CC extended along the x-direction in FIG. 1A. The curves c1, c2 and c3 show exemplary falls in the net doping concentration Neff along the x-direction between the first and second locations P1, P2.

Depending on the type of setting of the lateral variation of the net doping concentration, e.g. depending on an implantation mask and/or a dopant source and also a subsequent thermal budget during the processing of the semiconductor component, it is possible to produce various profiles of the net doping concentration that also deviate from the falls in concentration in the curves c1, c2, c3 that are shown by way of example. In the progression of the net doping concentration that is illustrated by the profile c1, a maximum is present at the first location P1, while a minimum is present at the second location P2. In the progression of the net doping concentration that is illustrated by the profile c2, neither a maximum nor a minimum is present at the first location P1, while a minimum is present at the second location P2. In the progression of the net doping concentration that illustrated by the profile c3, a maximum is present at the first location P1, while neither a maximum nor a minimum is present at the second location. Likewise, neither a maximum nor a minimum may be present at the first and second locations P1, P2, depending on the locations within the mesa region at which the net doping concentration is determined.

Figure 3:
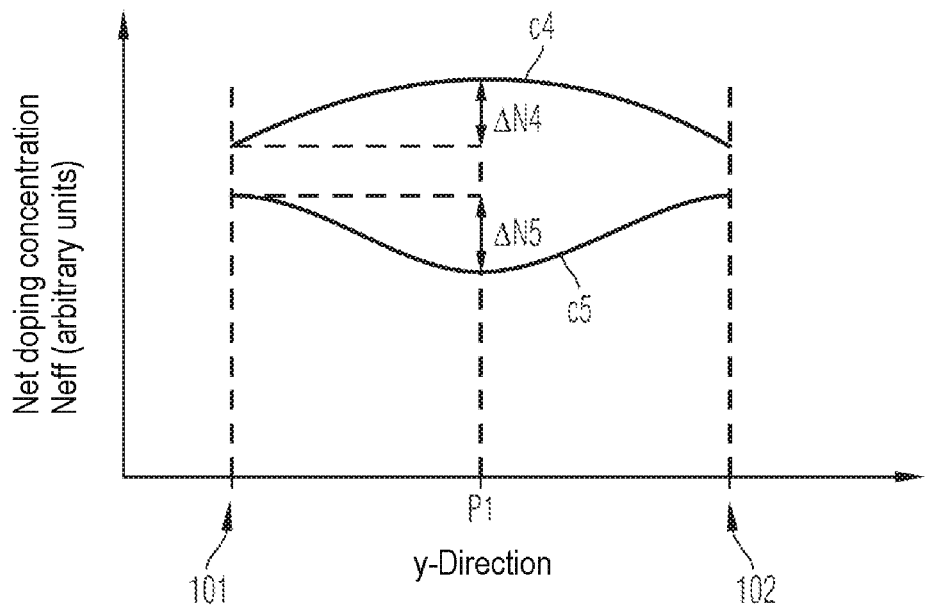
FIG. 3 shows exemplary profiles of the net doping concentration. Neff along the y-direction between the first trench structure 101 and the second trench structure 102 from FIG. 1A.

The schematic diagram of FIG. 3 snows exemplary profiles of the net doping concentration Neff along the y-direction between the first trench structure 101 and the second trench structure 102.

Figure 2:
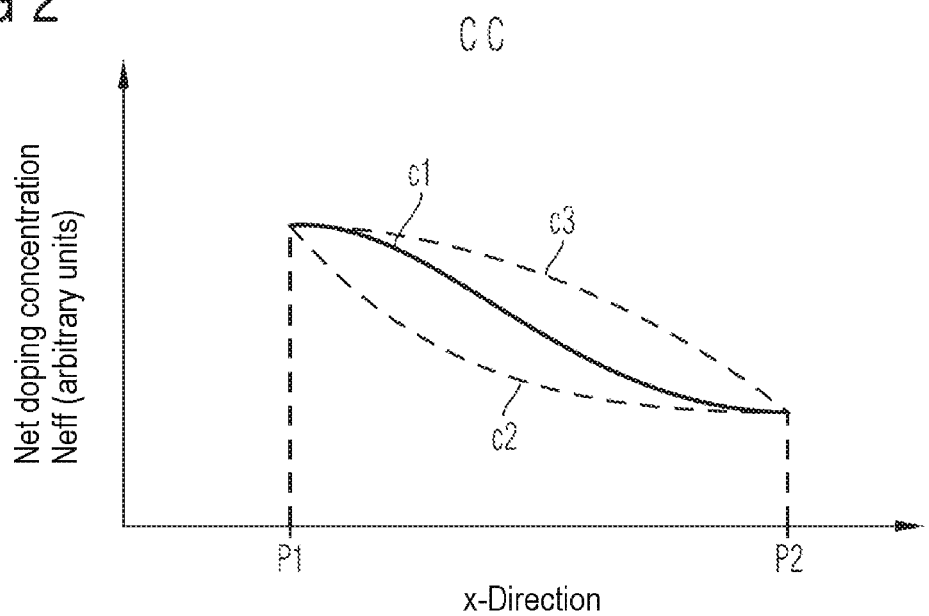
FIG. 2 shows a diagram with exemplary curves c1, c2 and c3 showing a fall is the net doping concentration Neff along the connecting line CC extended is the x-direction between. the first and second locations P1, P2 from FIG. 1A.

As has already been described above in association with profiles elucidated and shown in FIG. 2, the lateral variation of the net doping concentration in accordance with the profiles c4, c5 shown by way of example in FIG. 3 is also dependent on the chosen type of setting of the lateral variation of the net doping concentration Neff.

While the profile c4 of the net doping concentration Neff that is shown by way of example can be achieved for instance by local implantation of dopants at and/or around the first location P1 and subsequent outdiffusion and/or activation owing to the thermal budget arising during the processing of the semiconductor component, the profile c5 of the net doping concentration Neff that is shown by way of example can be attributable for instance to introducing dopants through sidewalls of the first and second trench structures 101, 102. Introducing the dopants through the sidewall of the first and second trench structures 101, 102 can be achieved for example by means of oblique implantation and/or deposition on the sidewall using a dopant source and subsequent indiffusion into the semiconductor body. Moreover, it is possible to set an excursion for ΔN4 and respectively ΔN5 in the profile progression, i.e. a difference between maximum and minimum net doping concentration Neff, taking account of the thermal budget following the introduction of the dopants, and the associated flattening of the profile as a result of diffusion.

In one embodiment, the net doping concentration Neff at the reference depth tref along a path section which extends around the first trench structure 101 and the distance d of which from the first trench structure 101 corresponds maximally to the second distance d2 has at least two maxima and at least two minima. This applies to arbitrarily selectable path sections having a maximum distance d2 from the first trench structure 101.

Figure 4A:
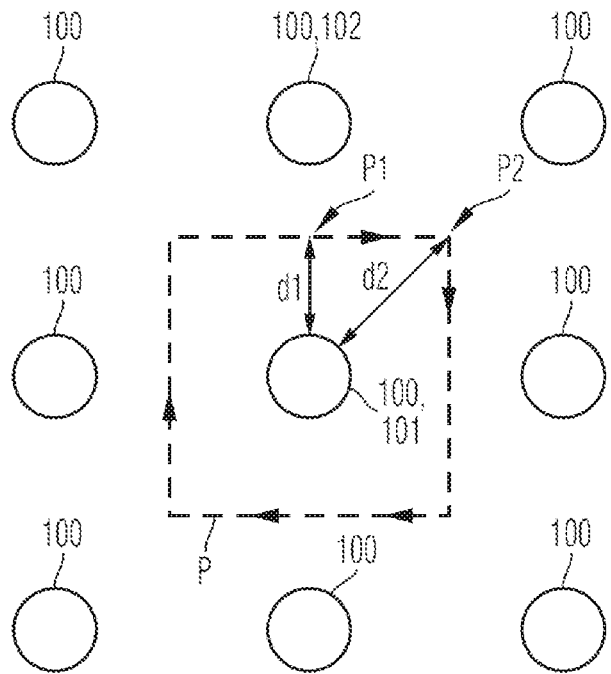
FIG. 4A shows a schematic plan view of trench structures of field effect transistor arrangements in accordance with one embodiment of the invention.
Figure 4B:
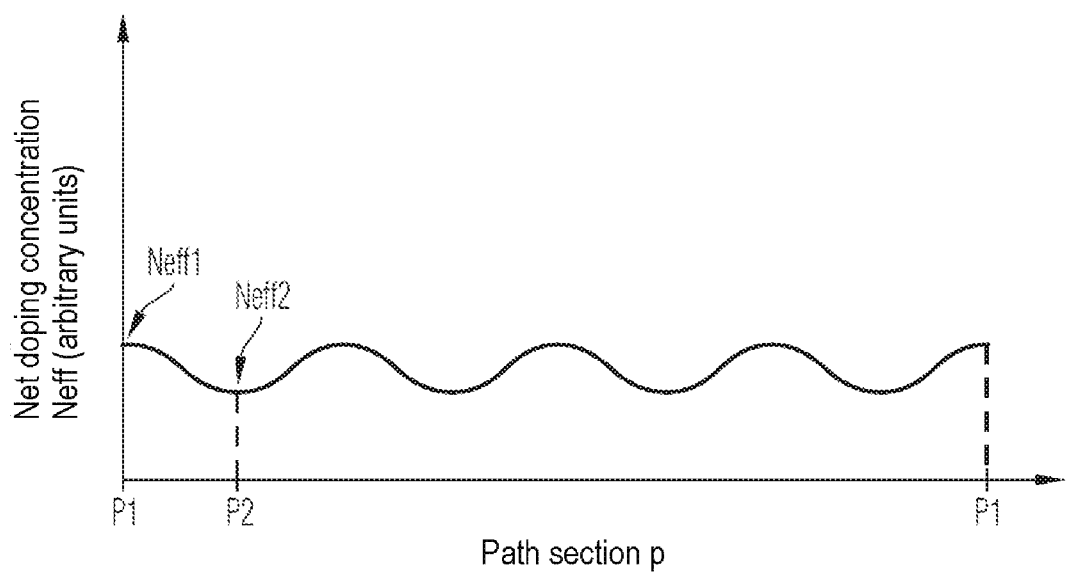
FIG. 4B shows an exemplary profile of the net doping concentration Neff along the path section p from FIG. 4A.

For the regular arrangement of the trench structures 100 that is shown in the plan view of FIG. 4A, the diagram shown in FIG. 4B gives an exemplary progression of the net doping concentration Neff along the path section p shown in the plan view of FIG. 4A, said path section passing through both the first location P1 and the second location P2.

In the example illustrated, the path section p comprises four maxima and four minima in the net doping concentration Neff. The number of maxima and minima can vary, of course, depending on the arrangement pattern of the trench structures 100. By way of example, a hexagonal arrangement of trench structures 100, cf. for example the plan view of FIG. 1B, would be assigned a greater number of maxima and minima along a path section extending around the first trench structure. Both at the first location, at the second location and also at any other location along the path section p, the first and second trench structures 101, 102 are the trench structures which are closest to the respective location along the path section, that is to say that at said locations, apart from the first trench structure 101 and the second trench structure 102, there are no other trench structures 100 which laterally are located even closer. However, as is the case at the second location P2 for instance in the plan views of FIG. 1A, there may be one or more further trench structures 100 that are at a same distance.

Figure 5A:
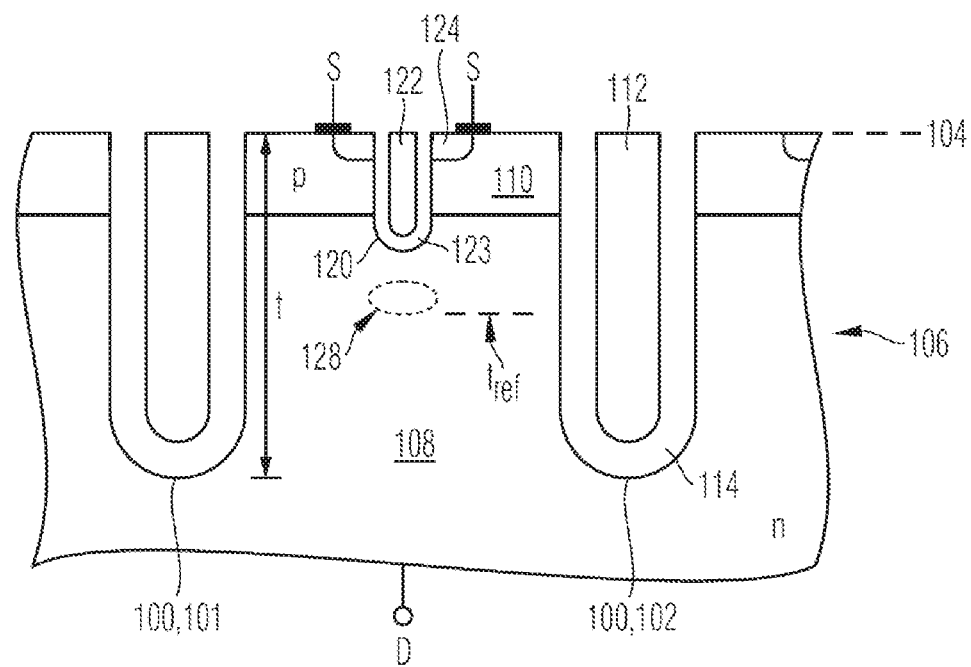
FIG. 5A shows a schematic cross-sectional view of a field effect transistor arrangement comprising a trench structure of a second type, which comprises a gate electrode.

Besides the trench structures 100 of the first type which comprise the first trench structure 101 and the trench structure 102, a field effect transistor arrangement in accordance with one embodiment comprises at least one trench structure 120 of a second type, as is shown by way of example in the schematic cross-sectional view of FIG. 5A. The at least one trench structure 120 of the second type comprises a gate electrode 122 and a gate dielectric 123 and extends from the first surface 104 into the semiconductor body 106 less deeply than the plurality of trench structures 100 of the first type. A source region 124, which corresponds to the conductivity type of the drift zone 108, and the body region 110, which deviates from the conductivity type of the drift zone, are electrically connected to a source contact S via the first surface 104. The drift zone 108 is electrically contacted with a drain contact D at an opposite side to the first surface 104. Consequently, the field effect transistor arrangement shown is a vertical semiconductor component in which a load current flows between the load electrodes, i.e. the source contact S and the drain contact D, substantially in a vertical direction.

In one embodiment, a maximum net doping concentration Neff of the drift zone 108 at the reference depth tref is positioned in a vertical direction below a bottom of the at least one trench structure 120 of the second type, which is illustrated by way of example by a region 128 identified in a dashed manner in the schematic cross-sectional view of FIG. 5A. Besides the maximum net doping concentration of the drift zone 108 at the reference depth tref, the region 128 elsewhere below the bottom of the at least one trench structure 120 can also identify the position of a minimum net doping concentration Neff at the reference depth tref. The at least one trench structure 120 of the second type can form a grid spanning square elements for example in the plan view shown in FIG. 1A, wherein the trench structures 100 are positioned at the centre of the square elements. The at least one trench structure 120 of the second type can form a grid spanning hexagonal elements for example in the plan view shown in FIG. 1B, wherein the trench structures 100 are positioned at the centre of the hexagonal elements.

Figure 5B:
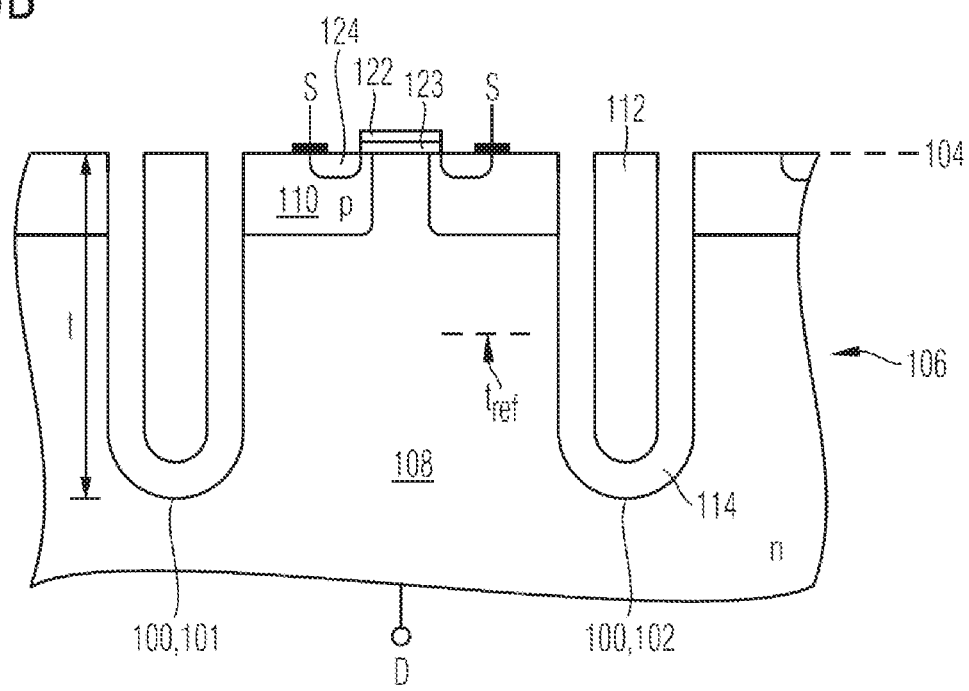
FIG. 5B shows a schematic cross-sectional view of a field effect transistor arrangement comprising a planar gate electrode.

As is illustrated schematically in the cross-sectional view of FIG. 5B, the field effect transistor arrangement can also comprise a planar gate structure, in which the gate electrode 122 is formed above the first surface 104 of the semiconductor body 106 and is electrically insulated from the semiconductor body 106 by the gate dielectric 123 formed between the first surface 104 and the gate electrode 122.

In one embodiment, the lateral variation of the net doping concentration Neff is set by virtue of a degree of compensation of the doping at the reference depth tref being greater at the second location P2 than at the first location P1. A corresponding lateral variation of the degree of compensation of the doping can be achieved for example by introducing the compensation doping via an implantation mask.

Figure 6A:
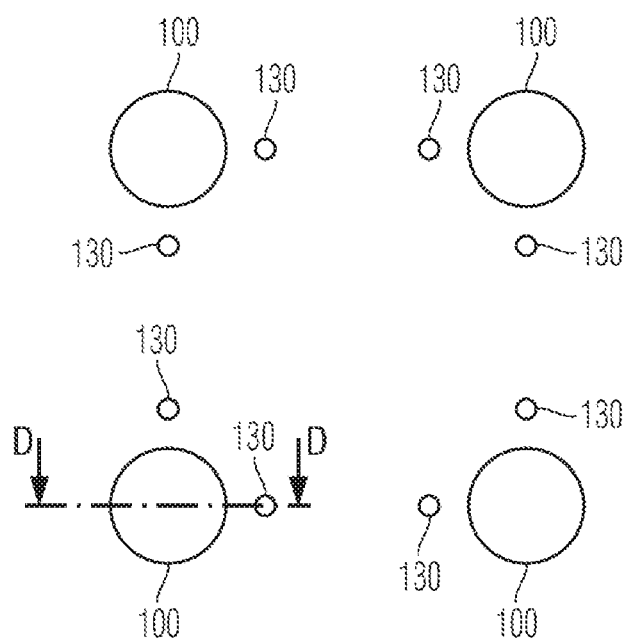
FIG. 6A shows a schematic plan view of a field effect transistor arrangement comprising a trench structure of a third type, which is at least partly filled with a dopant source.
Figure 6B:
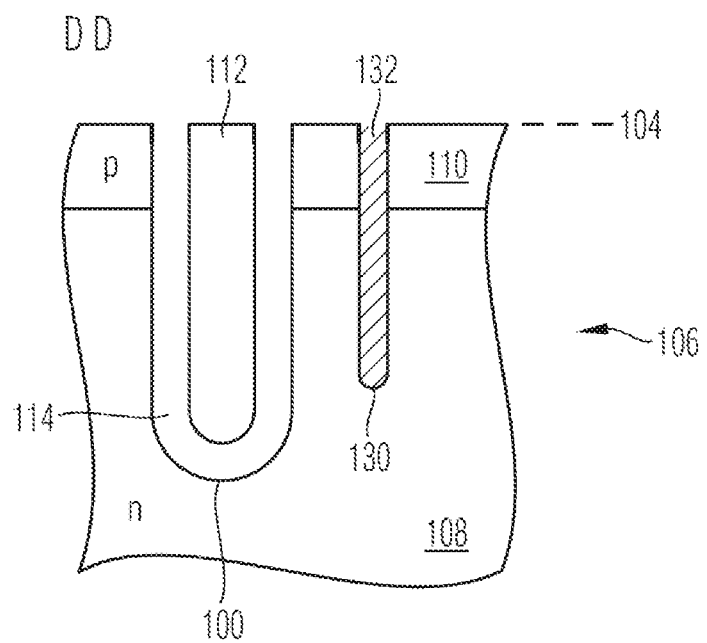
FIG. 6B shows a schematic cross-sectional view of the field effect transistor arrangement from FIG. 6A along the sectional line DD.

The schematic plan view of FIG. 6A shows a field effect transistor arrangement comprising at least one trench structure 130 of a third type. As is shown in FIG. 6B in the schematic cross-sectional view along the sectional line DD from FIG. 6A, the trench structure 130 of the third type comprises dopant source 132 and extends from the first surface 104 of the semiconductor body 106 into the semiconductor body 106 less deeply than the plurality of trench structures 100 of the first type. In one embodiment, the trench structure 130 of the third type extends into the semiconductor body 106 more deeply than the body region 110.

With the aid of the at least one trench structure 130 of the third type which is at least partly filled with the dopant source 132, a further possibility is afforded for designing the lateral variation of the net doping concentration Neff. As a result of the thermal budget following the formation of the dopant source 132 during the processing of the field effect transistor arrangement, dopants diffuse through the sidewall and/or the bottom of the at least one trench structure 130 of the third type and can be used for setting the lateral variation of the net doping concentration Neff.

In one embodiment, the dopant source 132 comprises doped polycrystalline silicon. The doped polycrystalline silicon can be of the conductivity type of the drift zone 108 and can thus serve for locally raising the net doping concentration. Neff relative to an original doping of the drift zone 108. Moreover, the doped polycrystalline silicon can be of a different conductivity type from the conductivity type of the drift zone 108 and can thus locally reduce the net doping concentration. Neff by partial compensation of the original doping in the drift zone 108. It goes without saying that some of the trench structures 130 of the third type can also serve for locally raising the net doping concentration Neff, while other trench structures from among the trench structures 130 of the third type serve for reducing the net doping concentration by partial compensation of the original doping of the drift zone 108.

The schematic plan view of FIG. 6A schematically illustrates the trench structures of the first and third types 100, 130. It goes without, saying that trench structures of the second type can additionally be present as well, for example if the field effect transistor arrangement is a field effect transistor arrangement comprising a gate electrode structure arranged in trenches, as shown in the schematical cross-sectional view of FIG. 5A.

Figure 7:
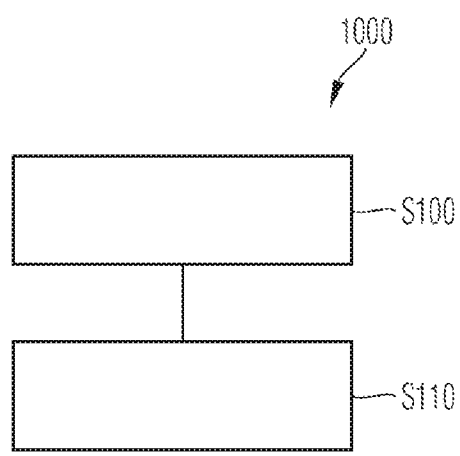
FIG. 7 shows a schematic diagram with method feature complexes for producing a field effect transistor arrangement.

The schematic diagram in FIG. 7 illustrates a method 1000 for producing a semiconductor component with reference to method feature complexes S100 and S110.

Although the method 1000 is illustrated and described below as a series of method feature complexes, it should be pointed out that the method steps underlying the method feature complexes can be performed for example in part simultaneously or else in part differently by comparison with the order suggested in FIG. 7. This will be discussed in even greater detail below.

It goes without saying that in addition to the method feature complexes S100 and S110 further method feature complexes are required in order to complete a semiconductor component.

The method 1000 comprises forming a field effect transistor arrangement in a semiconductor body.

The method feature complex S100 comprises forming a plurality of trenches of a first type comprising first and second trenches, which extend from a first surface into the semiconductor body and have a maximum lateral dimension at the first surface which is less than a depth of the first and second trenches, wherein the first trench and the second trench are directly adjacent.

The method feature complex S110 comprises setting a net doping concentration in a drift zone at a first location, which is at a same first lateral distance from the first trench and from the second trench, to be at least 10% greater than at a second location, which is at a same second lateral distance from the first trench and from the second trench, wherein the second distance is greater than the first distance and the first location and also the second location are located at a reference depth between the first surface and a bottom of the first trench.

In one embodiment, a field dielectric and a field electrode are formed in the plurality of trenches of the first type.

Figure 8:
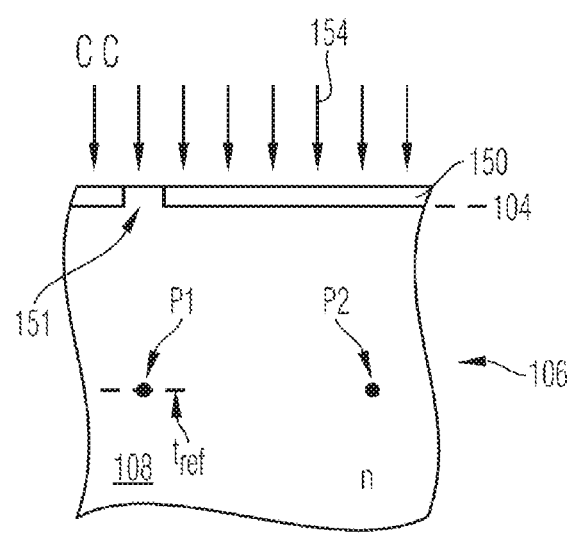
FIG. 8 is a schematic cross-sectional view for illustrating a masked implantation for increasing the net doping concentration in the drift zone.

In one embodiment, setting the net doping concentration in the drift zone comprises implanting dopants of a conductivity type corresponding to the conductivity type of the drift zone, and the dopants are implanted into the semiconductor body through an opening of an implantation mask that is formed above the first location P1 in a vertical direction, and said dopants are prevented from being implanted into the semiconductor body by the implantation mask above the second location. The schematic cross-sectional view of FIG. 8 shows an implantation mask 150 having an opening 151 above the first location P1. The implantation mask 150 covers the first surface 104 of the semiconductor body 106 above the second location P2 and thus prevents or reduces an implantation of n-type dopants 154 identified by arrows into the semiconductor body 106. Consequently, the net doping concentration Neff is locally raised at the first location P1 of the n-type drift zone 108 as a result of the implantation.

Figure 9:
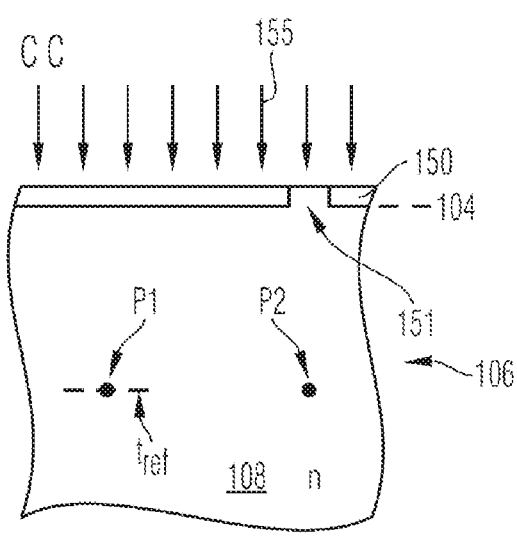
FIG. 9 is a schematic cross-sectional view for illustrating a masked implantation for decreasing the net doping concentration in the drift zone.

In a further embodiment, setting the net doping concentration in the drift zone comprises implanting dopants of a conductivity type different from the conductivity type of the drift zone, and the dopants are implanted into the semiconductor body through an opening of an implantation mask that is formed above the second location in a vertical direction, and said dopants are prevented from being implanted into the semiconductor body by the implantation mask above the second location. The schematic cross-sectional view of FIG. 9 shows the implantation mask 150 having the opening 151 above the second location P2. The implantation mask 150 covers the first surface 104 of the semiconductor body 106 above the first location P1 and thus prevents or reduces an implantation of p-type dopants 155 identified by arrows into the semiconductor body 106. Consequently, the net doping concentration. Neff is locally reduced at the second location P2 of the n-type drift zone 108 as a result of the implantation.

In a further embodiment, the method additionally comprises forming at least one trench of a second type which extends from the first surface into the semiconductor body less deeply than the plurality of trenches of the first type, wherein the dopants shown in FIG. 8 or else the dopants shown in FIG. 9 are implanted through a bottom of the at least one trench. After the implantation, by way of example, a gate dielectric and a gate electrode are formed in the trench of the second type.

Figure 10A:
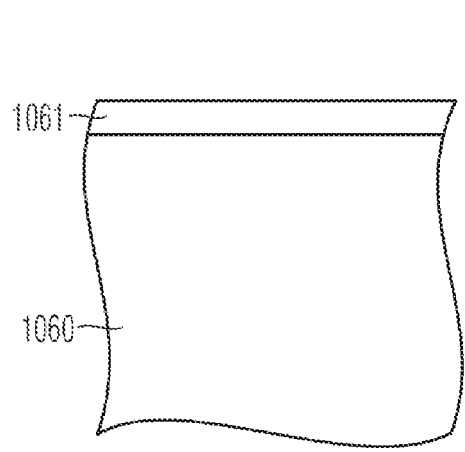
FIGS. 10A to 10D are schematic cross-sectional views for elucidating a method for locally varying the net doping concentration in the drift zone.
Figure 10B:
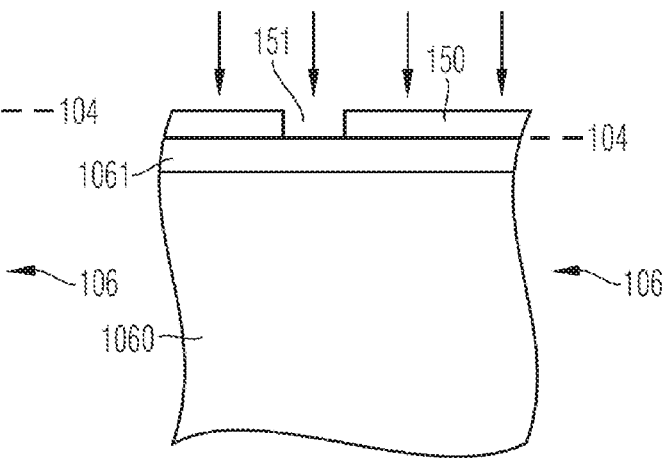
Figure 10C:
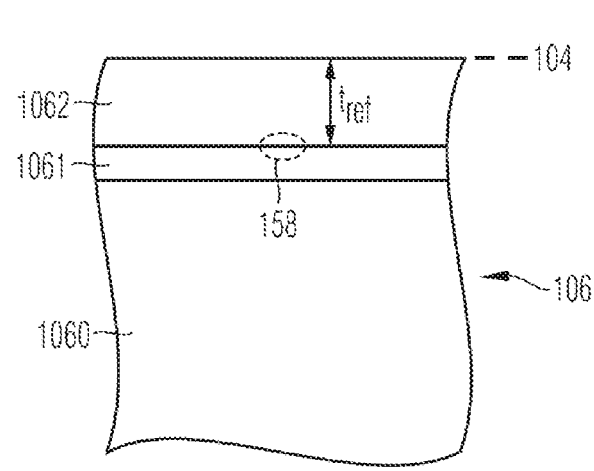
Figure 10D:
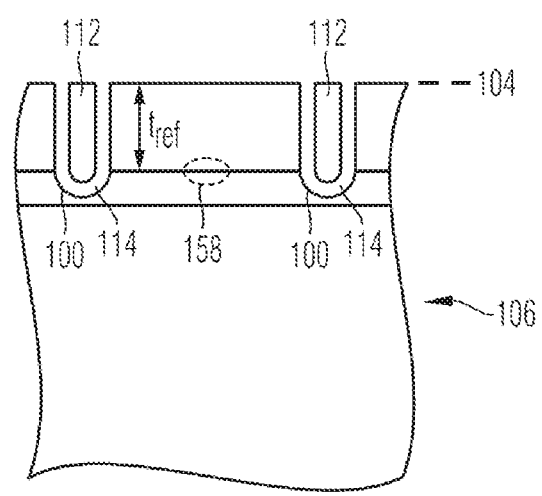

In one embodiment, implanting dopants is carried out before forming a plurality of trenches of a first type comprising first and second trenches, and a thickness of the semiconductor body is then increased by applying a semiconductor layer on the first surface of the semiconductor body. This embodiment is suitable for example for field effect transistor arrangements of relatively high voltage classes, in which an implantation into the reference depth tref can be realized with difficulty or cannot be realized. In the schematic cross-sectional view of FIG. 10A, by way of example, a thickness of the semiconductor body 106 at the first surface 104 is increased by applying a first semiconductor layer 1061 by a suitable method such as e.g. epitaxy on a semiconductor substrate 1060. The dopants for the lateral variation of the net doping concentration Neff are then implanted, cf. the cross-sectional view of FIG. 10B, through the opening 151 of the implantation mask 150 to the desired location in the semiconductor body, e.g. to the first location P1 as shown in FIG. 8 or to the second location P2 as shown in FIG. 9. Referring to the cross-sectional view of FIG. 10C, the thickness of the semiconductor body 106 at the first surface 104 is increased further by applying a second semiconductor layer 1062. Depending on the desired voltage class, the masked implantation shown in FIG. 10B and the increase in the thickness of the semiconductor body 106 as shown in FIG. 10C can be repeated one or more times, such that at least one implanted region 158 arises at the reference depth tref before the trench structures 100 are then produced, as is illustrated in the schematic cross-sectional view of FIG. 10D.

Figure 11A:
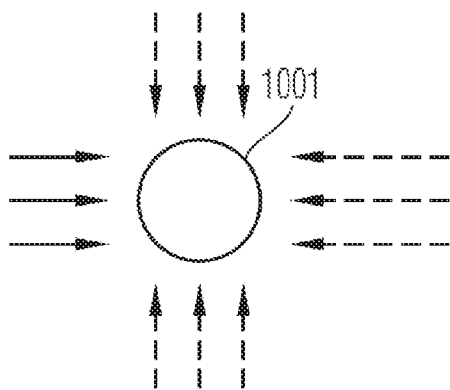
FIGS. 11A and 11B show a schematic plan and cross-sectional view for elucidating a further method for locally varying the net doping concentration in the drift zone.
Figure 11B:
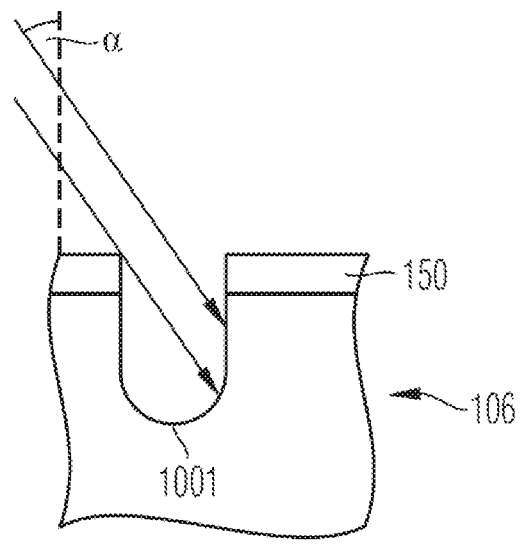

In one embodiment, setting the net doping concentration Neff in the drift zone 108 is carried out by an oblique implantation of dopants of a conductivity type corresponding to the conductivity type of the drift zone through a sidewall of trenches 1001 in which the trench structures 100 arise. An oblique implantation is schematically illustrated in the plan view of FIG. 11A and the associated cross-sectional view of FIG. 11B. A tilt angle α of the ion beam can be chosen for example depending on a depth of the trenches 1001 or else a height of the implantation mask 150. Moreover, the oblique implantation can be performed multiply at different twist angles, which is indicated in FIG. 11A by means of the arrows illustrated in a dashed manner. The implantation at different twist angles makes it possible for example to improve the radial symmetry of the dopants introduced.

In a further embodiment, setting the net doping concentration in the drift zone comprises forming at least one trench of a third type which extends from the first surface into the semiconductor body, and forming a dopant source in the at least one trench of the third type and diffusing dopants from the dopant source into the drift zone via a sidewall of the at least one trench of the third type, cf. for example FIGS. 6A and 6B.

Although specific embodiments have been illustrated and described here, it is obvious to the person skilled in the art that a plurality of alternative and/or equivalent designs can be used for the specific embodiments described and shown, without departing from the scope of the present invention. Therefore, this application is intended to cover any adaptations or modifications of the specific embodiments described here. Therefore, the intention is for this invention to be limited only by the patent claims and the equivalents thereof.

What is claimed is:

1. A semiconductor component, comprising:
    a field effect transistor arrangement in a semiconductor body, the field effect transistor arrangement comprising a drift zone and a body region between the drift zone and a first surface of the semiconductor body;
    a plurality of acicular trench structures comprising a first and a second acicular trench structure, which extend from the first surface into the semiconductor body and have a maximum lateral dimension at the first surface which is less than a depth of the first and second acicular trench structures; and
    at least one trench structure of a second type which comprises a gate electrode and a gate dielectric and extends from the first surface into the semiconductor body less deeply than the plurality of acicular trench structures,
    wherein the at least one trench structure of the second type forms grid spanning elements,
    wherein one of the first or second acicular trench structures is positioned at a centre of the grid spanning elements,
    wherein a net doping concentration is 10% greater at a first location in the drift zone than at a second location in the drift zone at a reference depth which is located between the body region and a bottom of the first acicular trench structure,
    wherein the first location is at a same first lateral distance from the first and from the second acicular trench structure, the second location is at a same second lateral distance from the first acicular trench structure and from the second acicular trench structure,
    wherein the second distance is greater than the first distance.

2. The semiconductor component of claim 1, wherein the first distance is a shortest lateral distance from the first acicular trench structure and from the second acicular trench structure.

3. The semiconductor component of claim 1, wherein the second distance is maximally double the magnitude of the first distance.

4. The semiconductor component of claim 1, wherein each acicular trench structure of the plurality of acicular trench structures comprises a field electrode and a field dielectric.

5. The semiconductor component of claim 1, wherein a minimum lateral dimension of the first acicular trench structure at the first surface is at least 20% of a maximum lateral dimension of the first acicular trench structure at the first surface.

6. The semiconductor component of claim 1, wherein the net doping concentration in the drift zone decreases continuously along a direct connecting line from the first location to the second location.

7. The semiconductor component of claim 1, wherein the doping concentration at the reference depth along a path section has at least two maxima and at least two minima, and wherein the path section extends around the first acicular trench structure and has a distance from the first acicular trench structure that corresponds maximally to the second distance.

8. The semiconductor component of claim 1, wherein a maximum doping concentration at the reference depth in a vertical direction is located below a bottom of the at least one trench structure of the second type.

9. The semiconductor component of claim 1, wherein a minimum doping concentration at the reference depth in a vertical direction is located below a bottom of the at least one trench structure of the second type.

10. The semiconductor component of claim 1, wherein a degree of compensation of the doping at the reference depth is greater at the second location than at the first location.

11. The semiconductor component of claim 1, further comprising:
    at least one trench structure of a third type which comprises a dopant source and extends less deeply from the first surface into the semiconductor body than the plurality of acicular trench structures.

12. The semiconductor component of claim 11, wherein the dopant source comprises doped polycrystalline silicon.

13. A semiconductor component, comprising:
    a field effect transistor arrangement in a semiconductor body, the field effect transistor arrangement comprising a drift zone and a body region between the drift zone and a first surface of the semiconductor body;
    a first trench structure extending from a first surface into the semiconductor body and having a maximum lateral dimension at the surface which is less than a depth of the trench structure, wherein the trench structure comprises a field electrode and a field dielectric; and
    a second trench structure which comprises a gate electrode and a gate dielectric and extends from the first surface into the semiconductor body less deeply than the first trench structure,
    wherein a net doping concentration at a reference depth, which is located between the body region and a bottom of the first trench structure, along a path section which extends around the first trench structure at the reference depth has at least two maxima and at least two minima.

14. The semiconductor component of claim 13, wherein a maximum lateral distance between the first trench structure and the path section extending around the first trench structure is less than a shortest lateral distance between the first trench structure and the second trench structure.

15. A method for producing a semiconductor component, the method comprising:
    forming a field effect transistor arrangement in a semiconductor body, comprising:
    forming a plurality of acicular trenches comprising a first and a second acicular trench, which extend from a first surface into the semiconductor body and have a maximum lateral dimension at the first surface which is less than a depth of the first and second acicular trenches, wherein the first acicular trench and the second acicular trench are directly adjacent;
    forming at least one trench structure of a second type which comprises a gate electrode and a gate dielectric and extends from the first surface into the semiconductor body less deeply than the plurality of acicular trenches, the at least one trench structure of the second type forming grid spanning elements, wherein one of the first or second acicular trench structures is positioned at a centre of the grid spanning elements; and
    setting a net doping concentration in a drift zone at a first location, which is at a same first lateral distance from the first acicular trench and from the second acicular trench, to be at least 10% greater than at a second location, which is at a same second lateral distance from the first acicular trench and from the second acicular trench, wherein the second distance is greater than the first distance and the first location and also the second location are located at a reference depth between the first surface and a bottom of the first acicular trench.

16. The method of claim 15, further comprising:
    forming a field dielectric and a field electrode in the plurality of acicular trenches.

17. The method of claims 15, wherein setting the net doping concentration in the drift zone comprises:
    implanting dopants of a conductivity type corresponding to the conductivity type of the drift zone,
    wherein the dopants are implanted into the semiconductor body through an opening of an implantation mask that is formed above the first location in a vertical direction.

18. The method of claim 15, wherein setting the net doping concentration in the drift zone comprises:
    implanting dopants of a conductivity type different from the conductivity type of the drift zone,
    wherein the dopants are implanted into the semiconductor body through an opening of an implantation mask that is formed above the second location in a vertical direction.

19. The method of claim 15, wherein the net doping concentration is set in the drift zone by implanting dopants, wherein the dopants are implanted before forming the plurality of acicular trenches, and wherein a thickness of the semiconductor body is then increased by applying a semiconductor layer on the first surface of the semiconductor body.

20. The method of claim 15, wherein setting the net doping concentration in the drift zone comprises:
    implanting dopants of a conductivity type corresponding to the conductivity type of the drift zone,
    wherein the dopants are implanted through a sidewall of the first and second acicular trenches.

21. The method of claim 15, wherein setting the net doping concentration in the drift zone comprises:
    forming at least one trench of a third type which extends from the first surface into the semiconductor body; and
    forming a dopant source in the at least one trench of the third type and diffusing dopants from the dopant source into the drift zone via a sidewall of the at least one trench of the third type.

22. The method of claim 21, wherein the dopant source comprises doped polycrystalline silicon.

* * * * *